United States Patent [19]

Landi

[11] Patent Number: 4,610,495

[45] Date of Patent: Sep. 9, 1986

[54] SOLDERLESS CONNECTOR APPARATUS AND METHOD OF MAKING THE SAME

[75] Inventor: Vincent R. Landi, Danielson, Conn.

[73] Assignee: Rogers Corporation, Rogers, Conn.

[21] Appl. No.: 708,981

[22] Filed: Mar. 7, 1985

[51] Int. Cl.⁴ ............................................... H01R 9/09
[52] U.S. Cl. ................................ 339/75 MP; 29/873; 339/17 F; 339/176 MF
[58] Field of Search ........... 339/17 F, 176 MF, 75 M, 339/75 MP; 333/238; 174/117 F, 117 FF; 29/872, 873

[56] References Cited

U.S. PATENT DOCUMENTS

| | | | |
|---|---|---|---|
| 3,612,744 | 10/1971 | Thomas | 174/117 FF |
| 3,643,201 | 2/1972 | Harwood | 333/238 |
| 3,651,432 | 3/1972 | Henschen et al. | 333/238 |
| 4,382,236 | 5/1983 | Suzuki | 174/117 FF |
| 4,443,657 | 4/1984 | Hill et al. | 174/117 F |
| 4,468,074 | 8/1984 | Gordon | 339/75 M |

Primary Examiner—John McQuade
Attorney, Agent, or Firm—Fishman & Dionne

[57] ABSTRACT

A solderless connection method and apparatus is presented wherein means are provided to either gradate or minimize the change in impedance between the contact portions of circuits which are to be connected therein. In a first embodiment of the present invention, a solderless electrical connector is provided in which impedance is gradated between the two different characteristic impedances of the circuits which are to be connected. The procedure for carrying out such a gradual change in impedance is the change in dielectric constant caused by compression of a shaped cellular polymeric material. In a second embodiment, a solderless electrical connection is provided which applies even pressure across the circuit element, but which also has a low dielectric constant. Such a connector includes syntactic foam produced by adding hollow microspheres, such as glass or silica microspheres, to an elastomer.

36 Claims, 8 Drawing Figures

SOLDERLESS CONNECTOR APPARATUS AND METHOD OF MAKING THE SAME

BACKGROUND OF THE INVENTION

This invention relates to a method and apparatus for interconnecting electrical circuit elements. More particularly, this invention relates to a new and improved solderless connector for establishing and maintaining electrical contact between circuit elements, while reducing or minimizing the change in impedance between the solderless connector body and the circuit devices which are to be connected therein.

A conventional method of interconnecting electrical or electronic circuit components consists of soldering terminals on the components to conductors which deliver current to or from the components. While generally suitable for its intended purposes, interconnecting electrical components via soldering terminals does suffer from certain drawbacks and deficiencies. For example, the substrate which supports an exposed terminal must be able to withstand relatively high temperatures with no adverse effects. Also, soldering connections can be time consuming and therefor be labor intensive and expensive. Another problem with soldered connections is the relative difficulty in disconnecting a soldered terminal during repairs and manufacturing.

In some applications it has been found desirable to replace soldering as a technique for use in establishing connections to flexible and other circuits. In these applications, the requisite electrical contact may be established by mechanically pressing the terminal portions of the circuit against terminal pads on the connector, device or another circuit. Such prior art pressure connections are customarily made with the aid of a solid resilient pressure applicator, such as an elastomeric member, which is placed in compression to bias at least one of the components to be electrically interconnected toward the other component to hold the terminal portions thereof in electrical contact. Such a solderless connection system is disclosed in U.S. Pat. No. 4,468,074, assigned to the assignee hereof and incorporated herein by reference.

While pressure connections of the type briefly described above facilitate circuit assembly and repair, and also allow for the use of low cost and low temperature plastics while eliminating the time consuming and thus costly step of soldering, the prior art pressure connectors have certain drawbacks and problems. For example, in high frequency electrical circuits, a sudden change or discontinuity in impedance can cause unwanted signal reflections. Such a condition may exist if two portions of a circuit, each portion having different characteristic impedances, are joined together. This impedance mismatch often arises from differences in dielectric constant of the connector materials as compared to the surroundings of the circuit elements outside of the connector. Thus, for example, two flexible circuits connected without solder by pressing together the conductors using a compressed elastomeric element (as described above) are subject to the change in surrounding dielectric constant caused when the flexible circuit leaves an environment of air and enters the connector.

SUMMARY OF THE INVENTION

The above-discussed and other problems of the prior art are overcome or alleviated by the solderless connection method and apparatus of the present invention. In accordance with the present invention, means are provided for either gradating or minimizing the change in impedance between the circuit device which are to be connected and the solderless connector body.

In a first embodiment of the present invention, a solderless electrical connector is provided in which impedance is gradated between the two different characteristic impedances of the circuits which are to be connected. In some cases, depending on the frequency of the signal, the impedance differences between the circuits, and the distance over which the gradation is effected, gradated impedance can lessen the severity of reflected signals. The effect envisioned for carrying out such a gradual change in impedance is the change in dielectric constant caused by compression of a shaped cellular polymeric material. Thus, if a wedge shaped elastomeric cellular material is compressed between parallel plates, the part of the material which undergoes greater compression has a higher dielectric constant.

In a second embodiment of the present invention, a solderless electrical connection is provided which applies even pressure across the circuit element, but which also has a low dielectric constant. Such a connector includes syntactic foam produced by adding hollow microspheres, such as glass microspheres, to a cellular foam. This syntactic foam material would minimize the change in the dielectric constant environment of the circuit element as it enters the connector.

The above-discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENTS

Figure 1A:
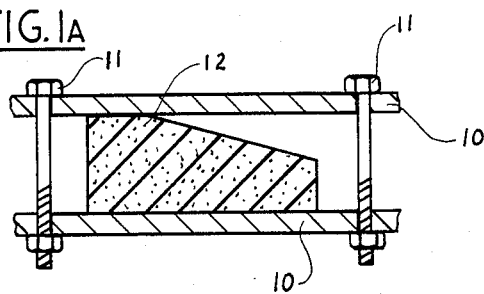
FIG. 1A is a cross-sectional elevation view of wedge shaped elastomeric material prior to compression used in conjunction with the solderless connector of the present invention.
Figure 1B:
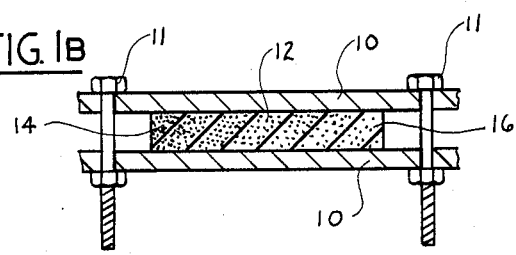
FIG. 1B is a cross-sectional elevation view of the elastomeric material of FIG. 1A after compression.

Referring first to FIG. 1A, a portion of a solderless connector comprising a pair of parallel rigid plates 10 sandwiching a wedge of elastomeric cellular material 12 is shown. In FIG. 1B, force exerted on rigid plates 10 by a suitable clamping mechanism such as bolts or screw 11 have caused the elastomeric material to compress as shown. Because of the varying thickness of the wedge of elastomeric material, the compression of elastomeric element 12 will vary between the highest compression at 14 (where the largest amount of elastomer is compressed) to the lowest compression at 16 (where the smallest amount of elastomer is compressed). Similarly, it has been found that the dielectric constant $E_r$ will vary between the highest $E_r$ at 14 and the lowest $E_r$ at 16. As will be discussed in more detail hereinafter, the net effect to the varying dielectric constant of the wedge shaped elastomer 12 is to provide a gradual change in impedance to circuits or other components being connected by the solderless connector.

Figure 2A:
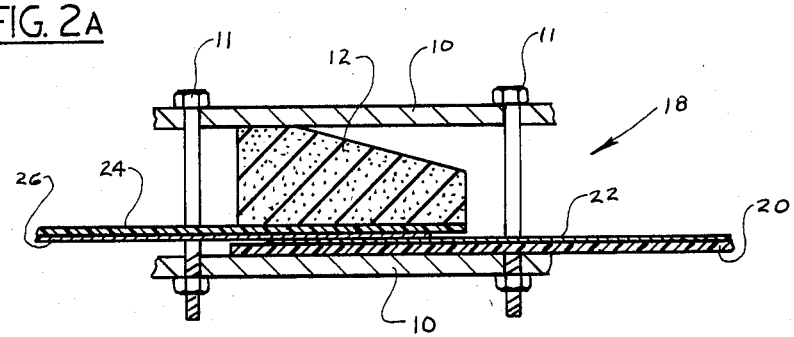
FIG. 2A is a cross-sectional elevation view of the gradated impedance solderless connector prior to compression in accordance with the present invention.
Figure 2B:
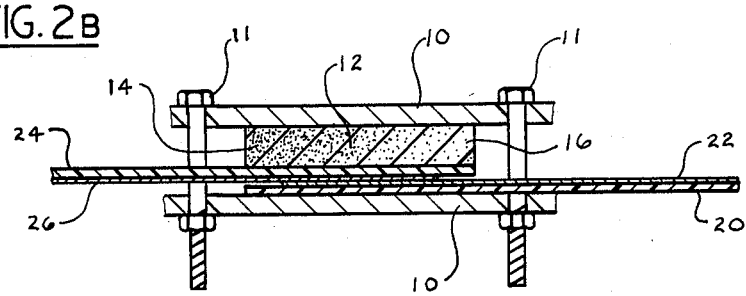
FIG. 2B is a cross-sectional elevation view of the solderless connector of FIG. 2A after compression.

Turning now to FIGS. 2A and 2B, a full solderless connector in accordance with the present invention is shown generally at 18. Connector 18 comprises a clamp frame or parallel rigid plates 10 interconnected by bolts 11 sandwiching a rigid or flexible substrate 20 having a conductor 22 thereon against a rigid or flexible circuit substrate 24 having a conductor 26 thereon via the stress transmitted by the wedge shaped elastomeric element 12. FIG. 2A is similar to FIG. 1A in that wedge 12 has not yet been compressed while wedge 12 has been compressed in FIG. 2B.

As in FIG. 1B, the compressed wedge shaped elastomeric foam of FIG. 2B will provide a variation in the dielectric constant $E_r$ of the elastomer 12 between a higher $E_r$ at 14 (high compression of wedge 12) and a lower $E_r$ at 16 (low compression of wedge 12). Thus, the wedge shaped elastomeric element 12 will effect a gradual change in impedance in relation to the changing dielectric constant. It will be appreciated that while a wedge shaped elastomeric element has been described, any other suitably shaped elastomer having a varying dielectric constant when compressed may equally be used in accordance with the present invention.

Figure 3A:
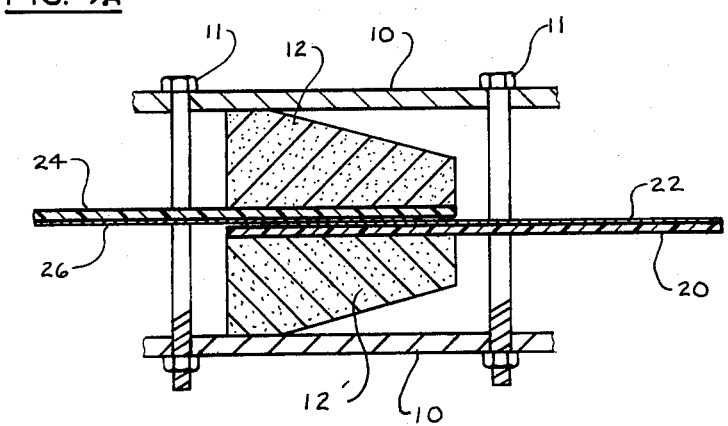
FIG. 3A is a cross-sectional elevation view of another embodiment of a solderless connector prior to compression in accordance with the present invention.
Figure 3B:
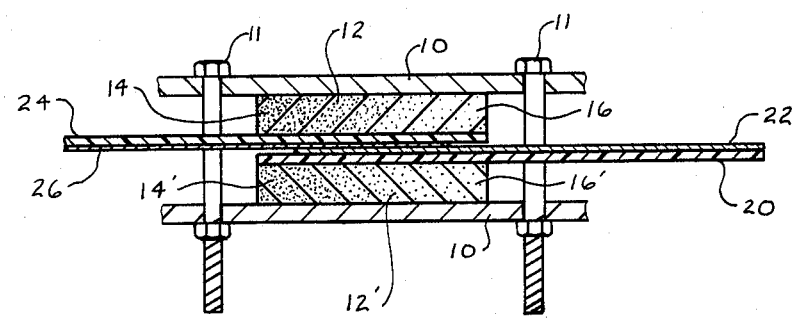
FIG. 3B is a cross-sectional elevation view of the solderless connector of FIG. 3A after compression.

Referring now to FIGS. 3A and 3B, another embodiment of a solderless connector in accordance with the present invention is shown. FIGS. 3A and 3B are identical to FIGS. 2A and 2B, respectively, but with the addition of a second wedge shaped elastomeric element 12' being provided oppositely disposed from element 12. The embodiment of the present invention shown in FIGS. 3A and 3B is preferable so far as providing double sided gradated impedance to the solderless connector. Thus, problems produced by discontinuities or sudden changes in characteristic impedance values at solderless connection sites may be furthur reduced.

It will be appreciated that the polymeric foams used in conjunction with the embodiment of the present invention shown in FIGS. 1-3 may include simple polymeric foam or a suitable filled polymeric foam. The addition of appropriate fillers, at appropriate levels, could cover a greater range of gradated dielectric constant than the foam of the pure polymeric matrix. For example, the addition of powdered titanium dioxide in the rutile crystalline form which has a dielectric constant on the order of 100, to a polyurethane foam with a dielectric constant on the order of 3 could give a much broader "ramp" of dielectric constant in a compressed foam based on this mixture. Thus, the "filling" may be tailored to provide the dielectric ranges and magnitudes necessary for a large variety of applications.

Figure 4:
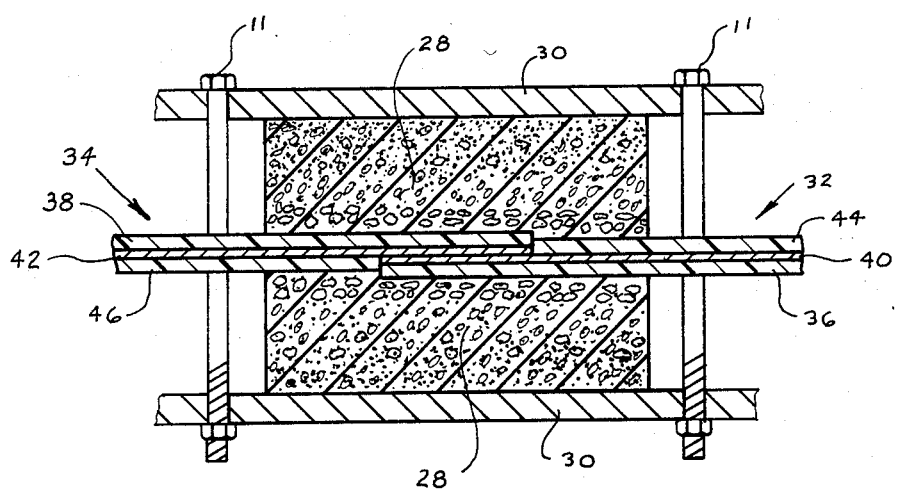
FIG. 4 is a cross-sectional elevation view of yet another embodiment of the solderless connector in accordance with the present invention.

In FIG. 4, yet another embodiment of the present invention is shown. FIG. 4 discloses a pair of uncompressed elastomeric elements 28 disposed between a pair of bolted clamps or rigid plates 30 and effecting connection between two circuits 32 and 34 comprised of substrates 36, 38, conductors 40, 42 and protective cover film 44, 46. The elastomeric elements 28 are syntactic foam produced by adding hollow microspheres, preferably glass or silica microspheres to provide a contacting medium which evenly applies pressure across the circuit element, but which also has a low dielectric constant. A foam such as described in FIG. 4 is only slightly compressible as distinguished from the highly compressible elastomeric foams used in the prior art. As a result, the change of the dielectric constant environment of the circuit element would be minimized as it enters the connector. Thus, in accordance with the embodiment of the instant invention in FIG. 4, elastomeric element 28 is tailored to provide for lower dielectric constant than is found in the prior art so as to minimize any abrupt changes in impedance values within the solderless connectors.

Figure 5:
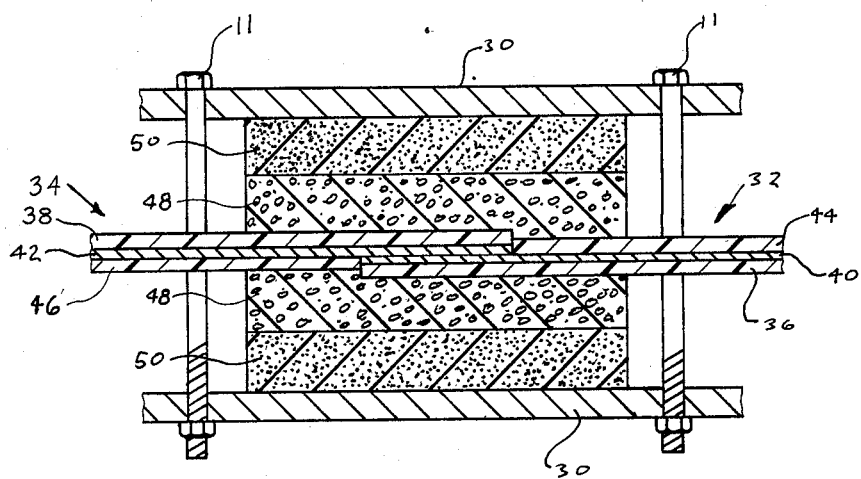
FIG. 5 is a cross-sectional elevation view, similar to FIG. 4, of another embodiment in accordance with the present invention.

Referring to FIG. 5, in a preferred embodiment, the elastomeric element 28 of FIG. 4 is a two layered foam wherein the first layer 48 is closest to the circuit elements 32 and 34 and is comprised of a slightly compressible syntactic foam layer as described above and the second (upper) layer 50 is comprised of a highly compressible cellular foam layer such as is normally found in the prior art. Thus, upon compression by the rigid plates 30, the highly compressible foam layer will transmit stress from the plates 30 to the terminal portions on the circuit elements 32 and 34 while the slightly compressible foam layer having a relatively lower dielectric constant will act to minimize impedance mismatch within the solderless connector.

In accordance with the present invention, the material which defines the elastomeric material 12 of FIGS. 1-3, and layer 50 of FIG. 5 preferably consists of an open called visco-elastic polymer and, in the preferred embodiment, a polyurethane foam. Particularly good results have been obtained employing a urethane formulation comprising a mixed polyester/polyether system. One open cell material suitable for use in the practice of the present invention is R/Flex 8770 obtainable from Rogers Corporation, Rogers, Conn. This material is characterized by a compressive load deflection at 25% compression in the range of 5 to 10 psi. A resilient material for use in the present invention is preferably characterized by a compression set of less than 5%. The compression set is tested in accordance with ASTM standard D-1564 wherein a two inch square and one inch thick stack of sheets of material (about 60 mils/sheet) are compressed 50% to $\frac{1}{2}$ inch thickness, the compressed material is subjected to 158° F. for 22 hours, the compression is released and the thickness is measured. The compression set of the R/Flex 8770 material after 5 hours of steam autoclaving prior to performing test ASTM D-1564 is less than 10%.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. In a solderless connector wherein mechanical means applies force against an elastomeric element to effect electrical contact between terminal portions of circuit devices, the improvement comprising:

means for providing gradated impedance to said solderless connector, said means for providing gradated impedance including;
said elastomeric element having a preselected shape whereby the dielectric constant of said elastomeric element is varied when said elastomeric element is compressed.

2. The solderless connector of claim 1 wherein:
said preselected shape of said elastomeric element is a wedge shape.

3. The solderless connector of claim 1 wherein:
said elastomeric element is a highly compressible cellular foam.

4. The solderless connector of claim 1 wherein:
said elastomeric element is a filled polymeric foam.

5. In a solderless connector wherein mechanical means applies force against an elastomeric element to effect electrical contact between terminal portions of circuit devices, the improvement comprising:
means for providing minimized impedance to said solderless connector, said means for providing minimized impedance including;
said elastomeric element being formed of slightly compressible syntactic foam whereby said slightly compressible syntactic foam has a low dielectric constant relative to highly compressible cellular foam.

6. The solderless connector of claim 5 wherein:
said slightly compressible syntactic foam is comprised of elastomeric material having hollow microspheres therein.

7. The solderless connector of claim 6 wherein:
said hollow microspheres are glass or silica microspheres.

8. The solderless connector of claim 5 wherein:
said elastomeric element has first and second layers and wherein said first layer is comprised of slightly compressible syntactic foam and said second layer is comprised of highly compressible cellular foam.

9. The solderless connector of claim 8 wherein:
said syntactic foam is comprised of elastomeric material having hollow microspheres therein.

10. The solderless connector of claim 9 wherein:
said hollow micrspheres are glass or silica microspheres.

11. In a method of making a solderless connector wherein mechanical means applies force against an elastomeric element to effect electrical contact between terminal portions of circuit devices, the improvement comprising:
shaping said elastomeric element so as to vary the dielectric constant of said elastomeric element when said elastomeric element is compressed wherein said solderless connector is provided with gradated impedance.

12. The method of claim 11 including:
shaping said elastomeric element into a wedge shape.

13. The method of claim 11 wherein:
said elastomeric element is a highly compressible cellular foam.

14. The method of claim 11 wherein:
said elastomeric element is a filled polymeric foam.

15. In a method of making a solderless connector wherein mechanical means applies force against an elastomeric element to effect electrical contact between terminal portions of circuit devices, the improvement comprising:
forming said elastomeric element of slightly compressible syntactic foam wherein said slightly compressible foam has a low dielectric constant relative to highly compressible cellular foam and whereby said solderless connector is provided with minimized impedance.

16. The method of claim 15 including:
forming said slightly compressible syntactic foam from elastomeric material having hollow microspheres therein.

17. The method of claim 16 wherein:
said hollow microspheres are glass or silica microspheres.

18. The method of claim 15 including:
forming first and second layers in said elastomeric element wherein said first layer is comprised of said slightly compressible syntactic foam and said second layer is comprised of highly compressible cellular foam.

19. The method of claim 18 including:
forming said syntactic foam from elastomeric material having hollow microspheres therein.

20. The method of claim 19 wherein:
said hollow microspheres are glass of silica microspheres.

21. In a solderless connector wherein mechanical means applies force against an elastomeric element to effect electrical contact between terminal portions of circuit devices, the improvement comprising:
said elastomeric element including means for providing gradated change in impedance between said circuit devices and said solderless connector.

22. The solderless connector of claim 21 wherein said means for providing gradated change in impedance includes:
said elastomeric element having a preselected shape whereby the dielectric constant of said elastomeric element is varied when said elastomeric element is compressed.

23. The solderless connector of claim 22 wherein:
said preselected shape of said elastomeric element is a wedge shape.

24. The solderless connector of claim 21 wherein:
said elastomeric element is a highly compressible cellular foam.

25. The solderless connector of claim 21 wherein:
said elastomeric element is a filled polymeric foam.

26. The solderless connector of claim 21 wherein said means for providing gradated change in impedance includes:
said elastomeric element having a preselected shape whereby the compression along said elastomeric element is varied when said elastomeric element is compressed.

27. In a method of making a solderless connector wherein mechanical means applies force against an elastomeric element to effect electrical contact between terminal portions of circuit devices, the improvement comprising:
providing said elastomeric element with means for gradating change in impedance between said solderless connector and said circuit devices.

28. The method of claim 27 wherein said means for gradating impedance is provided by:
shaping said elastomeric element so as to vary the dielectric constant of said elastomeric element when said elastomeric element is compressed.

29. The method of claim 28 wherein:

said elastomeric element is wedge shaped.

30. The method of claim 27 wherein:
said elastomeric element is a highly compressible cellular foam.

31. The method of claim 27 wherein:
said elastomeric element is a filled polymeric foam.

32. The method of claim 27 wherein said means for gradating impedance is providing by:
shaping said elastomeric element so as to vary the compression along said elastomeric element when said elastomeric element is compressed.

33. In a solderless connector wherein mechanical means applies force against an elastomeric element to effect electrical contact between terminal portions of circuit devices, the improvement comprising:
said elastomeric element including means for providing minimized change in impedance between said circuit devices and said solderless connector.

34. The solderless connector of claim 33 wherein said means for providing gradated change in impedance includes:
said elastomeric element being formed of slightly compressible syntactic foam wherein said slightly compressible syntactic foam has a low dielectric relative to highly compressible cellular foam.

35. In a method of making a solderless connector wherein mechanical means applies force against an elastomeric element to effect electrical contact between terminal portions of circuit devices, the improvement comprising:
providing said elastomeric element with means for minimizing change in impedance between said solderless connector and said circuit devices.

36. The method of claim 35 wherein said means for minimizing change in impedance is provided by:
forming said elastomeric element of slightly compressible syntactic foam wherein said slightly compressible foam has a low dielectric constant relative to highly compressible cellular foam wherein said solderless connector is provided with minimized impedance.

* * * * *